United States Patent

Hsue et al.

[11] Patent Number: 5,946,571
[45] Date of Patent: Aug. 31, 1999

[54] METHOD OF FORMING A CAPACITOR

[75] Inventors: Chen-Chiu Hsue; Sun-Chieh Chien, both of Hsinchu, Taiwan

[73] Assignee: United Microelectronics Corp., Taiwan

[21] Appl. No.: 08/975,495

[22] Filed: Nov. 21, 1997

Related U.S. Application Data

[60] Provisional application No. 60/057,219, Aug. 29, 1997.

[51] Int. Cl.$^6$ .............................................. H01L 21/8242
[52] U.S. Cl. ......................... 438/255; 438/396; 438/398; 438/253
[58] Field of Search ..................................... 438/239, 244, 438/253, 254, 255, 260, 305, 366, 387, 396, 397, 398, 595, 964, 399; 257/303, 309

[56] References Cited

U.S. PATENT DOCUMENTS

| 4,818,715 | 4/1989 | Chao | 438/595 |
|---|---|---|---|
| 4,963,504 | 10/1990 | Huang | 438/305 |
| 5,340,763 | 8/1994 | Dennison | 438/398 |
| 5,622,889 | 4/1997 | Yoo et al. | 438/398 |
| 5,691,229 | 11/1997 | Okamura et al. | 438/254 |
| 5,721,153 | 2/1998 | Kim et al. | 438/398 |
| 5,733,808 | 3/1998 | Tseng | 438/239 |
| 5,759,895 | 6/1998 | Tseng | 438/255 |
| 5,824,592 | 10/1998 | Tseng | 438/253 |

Primary Examiner—Charles Bowers
Assistant Examiner—Jack Chen
Attorney, Agent, or Firm—Rabin & Champagne P.C.

[57] ABSTRACT

A DRAM capacitor is formed having a crown structure with a reduced number of processing steps. A planarized insulating layer is provided over the DRAM cell's transfer FET and a contact via is opened to one of the source/drain regions of the transfer FET. A layer of polysilicon is deposited to fill the contact via and to extend over the surface of the insulating layer, providing a thick polysilicon layer on the insulating layer. Conventional photolithography is used to define a first etching mask with an element on the thick polysilicon aligned over the contact via. The polysilicon layer is etched partially through using the first etching mask and the photoresist mask is removed. A layer of oxide is deposited over the elevated and recessed surfaces of the polysilicon layer and an etch back process is performed to form a second etching mask consisting of oxide spacer structures along the edges of the elevated portion of the polysilicon layer. Etching of the polysilicon layer is performed using the second etching mask, with the etch step proceeding completely through the recessed portions of the polysilicon layer and partially through the elevated portion of the polysilicon layer. The second etch mask is removed and a capacitor dielectric and an upper electrode are provided to complete formation of the charge storage capacitor for the DRAM cell.

15 Claims, 4 Drawing Sheets

METHOD OF FORMING A CAPACITOR

This application claims priority from provisional application Ser. No. 60/057,219, filed Aug. 29, 1997.

BACKGROUND OF THE INVENTION

1. Field of the Invention

The present invention relates to the formation of high density integrated circuits and, more particularly, to the formation of high density dynamic random access memories.

2. Description of the Related Art

There is a continuing trend toward increasing the storage density of integrated circuit memories to provide increased levels of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one, or vice versa. The surface area of the electrodes of the memory capacitors determines the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is accomplished using a transfer field effect transistor (FET). A contact between the bit line and the transfer FET is typically made to one of the source/drain electrodes of the transfer FET and the charge storage capacitor is typically formed in contact with the other of the source/drain electrodes of the transfer FET. Word line signals are supplied to the gate of the FET to connect the lower electrode of the charge storage capacitor through the transfer FET to the bit line contact facilitating the transfer of charge between the charge storage capacitor and the bit line.

Applying reduced design rules to a DRAM reduces the substrate surface area that can be devoted to the charge storage capacitor of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which is undesirable since the memory may be unavailable for data storage and readout transactions during refresh activities. In addition, reduced levels of charge storage might require more sophisticated data readout schemes or more sensitive charge sensing amplifiers. Thus, modern DRAMs require increased levels of capacitance in reduced substrate area DRAM cells. To this end, a variety of very complex capacitor structures having three dimensional charge storage surfaces have been proposed. In general, these complex capacitor structures are difficult to manufacture.

SUMMARY OF THE PREFERRED EMBODIMENTS

It is accordingly an object of the present invention to provide a more manufacturable DRAM incorporating an increased capacitance charge storage capacitor.

According to an aspect of the invention, an integrated circuit device is made by providing a transfer FET having a first source/drain region formed in a substrate and then forming an insulating layer over the transfer FET. A contact via is opened through the insulating layer to expose at least a portion of the first source/drain region and a conductive interconnect is provided within the contact via. A layer of conductive material is provided over the insulating layer and is connected to the first source/drain region through the conductive interconnect. A first etch mask is provided over the layer of conductive material and etching proceeds partially through the layer of conductive material using the first etch mask to define an elevated portion of the layer of conductive material. The elevated portion of the layer of conductive material has edges aligned with the first etch mask which extend above a recessed portion of the layer of conductive material. The first etch mask is removed and a second etch mask is formed adjacent the edges of the elevated portion of the layer of conductive material, leaving exposed a surface of the elevated portion of the layer of conductive material. Etching is performed partially through the elevated portion of the layer of conductive material and completely through the recessed portion of the layer of conductive material to define, at least in part, a lower electrode of a charge storage structure. A dielectric layer is provided over the lower electrode and an upper electrode is provided over the dielectric layer.

DETAILED DESCRIPTION OF THE PREFERRED EMBODIMENTS

Figure 1:
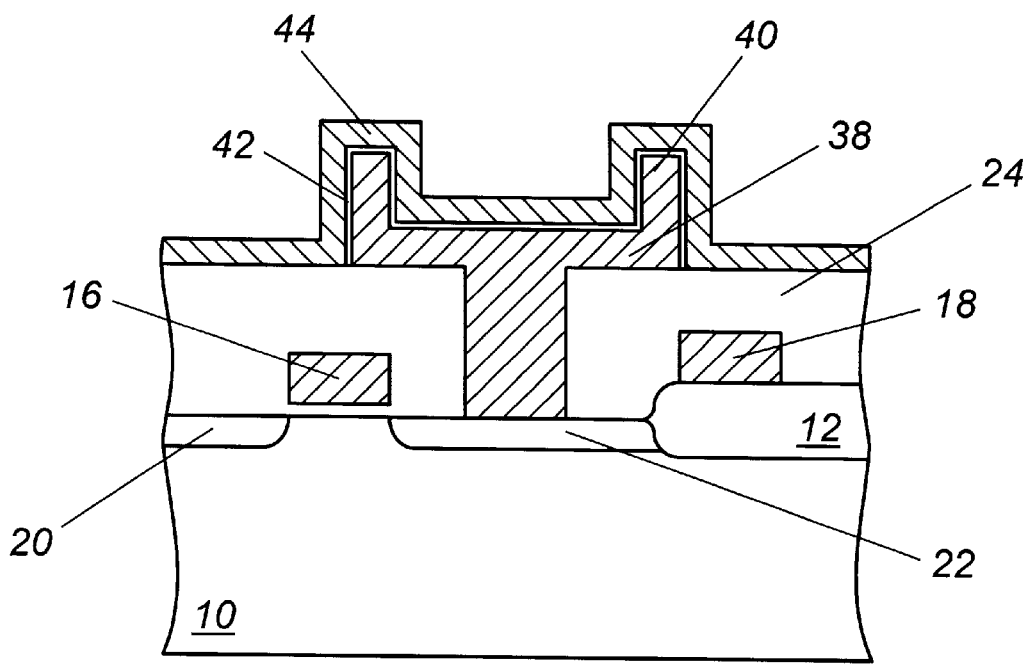
FIGS. 1–5 illustrate aspects of the formation of a DRAM in accordance with preferred embodiments of the present invention.

FIG. 1 illustrates a single cell of a DRAM formed in accordance with preferred embodiments of the present invention. The DRAM cell consists of a transfer FET having a gate electrode 16 and source/drain regions 20, 22. As is typical of such structures, a wiring line 18 runs through the DRAM cell as an extension of gate electrodes in one or more adjacent cells. One of the source/drain regions 20 of the transfer FET provides a bit line contact for the DRAM cell (not shown). The other of the source/drain regions 22 will serve as a contact for the lower electrode of the charge storage capacitor. The illustrated charge storage capacitor has the "crown" structure that provides increased levels of capacitance for the capacitor by providing vertically extending surface area on the capacitor electrode without consuming additional substrate area. The lower electrode includes a base plate 38 and fins 40 which extend above the plate, which are both covered by a capacitor dielectric 42 and by an upper electrode 44. As will be explained further below, variations on this basic structure are possible while still using methods in accordance with the present invention to form the crown structure.

It is typically necessary to perform repeated photolithography and etching steps to form a crown electrode having vertically extending fins 40 using conventional processes. Preferred embodiments of the present invention offer a simplified technology for providing a crown electrode structure using as few as a single photolithography step and, for example, three etching steps. According to such preferred embodiments, a transfer FET is provided for a DRAM cell, a planarized interlayer dielectric is deposited over the FET, and a via is etched through the interlayer dielectric to expose the appropriate source/drain region of the transfer FET. A thick polysilicon layer is deposited to fill the contact via and to cover the interlayer dielectric. Preferably, the polysilicon layer is deposited to a thickness that is approximately equal to the height that is desired for the fins 40 extending above the interlayer dielectric plus the thickness of the base plate 38. A photoresist mask is provided on the polysilicon layer, with a mask element positioned above the contact via. A thickness of the polysilicon layer approximately equal to the thickness desired for the base plate 38 of the charge storage electrode is etched to form a recessed surface around the mask element and then the photoresist mask is removed. A second etching mask is then provided over the partially etched polysilicon layer. Most preferably, the second etching mask is formed by blanket depositing oxide or another appropriate masking material over the etched polysilicon surface and then etching back the oxide to define spacer structures along the sidewalls of the unetched, elevated portion of the polysilicon layer. The oxide spacer structures are then used as a second etching mask for etching through the recessed portion of the polysilicon layer down to the surface of the interlayer dielectric. When this polysilicon etch process is stopped on the interlayer dielectric outside of the oxide spacer structures, there will remain a bottom plate portion 38 inside of the oxide spacer structures and connecting the vertically extending fins 40 because of the earlier partial etching of the polysilicon layer. Although it is not shown explicitly in these views, the fins 40 typically define a cylindrical or rectangular shell at the periphery of the bottom plate 38. Further processing continues to complete the charge storage capacitor.

As briefly illustrated above, practice of preferred embodiments of the present invention can provide a high capacitance charge storage capacitor for a DRAM or similar integrated circuit device using comparatively few lithography and etching steps. In addition, the mask used in the lithography step which defines the lower capacitor electrode has features which are significantly larger than the resolution limit typical of the process used to form other elements of the FIG. 1 structure. As such, less expensive processes and wider process margins can be used in forming DRAMs in accordance with the present method. These and other aspects of preferred embodiments of the invention are now described in further detail, along with alternate embodiments of the invention, with reference to the figures.

Figure 2:
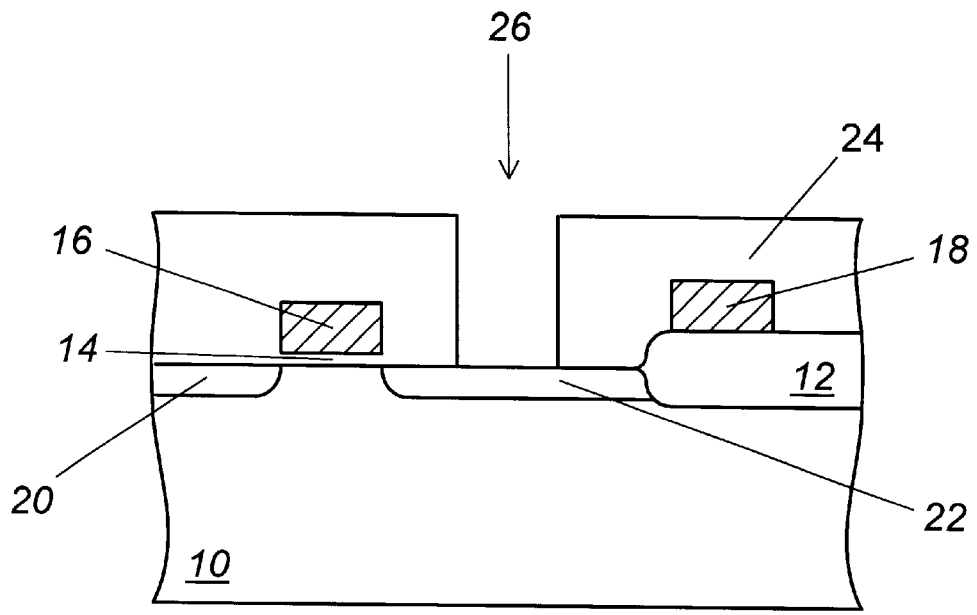

Formation of the transfer FET for the illustrated DRAM cell commences by growing a gate oxide layer 14 on the active device region between the field oxide regions 12 (FIG. 2). The gate oxide layer 14 is grown on the surface of the substrate to a typical thickness of about 30–200 Å by thermal oxidation in an oxygen environment at a temperature of 800–1000° C. Soon after the gate oxide layer is grown, a layer of polysilicon is deposited by low pressure chemical vapor deposition (LPCVD) over the surface of the device to a thickness of 1000–3000 Å and more preferably to a thickness of approximately 1500–2500 Å. This polysilicon layer will be incorporated into the transfer FET gate electrodes 16 and wiring lines 18 shown in FIG. 2. The gate electrode polysilicon layer is either doped in situ during deposition or by ion implantation, typically using arsenic or phosphorus, followed by annealing in the conventional fashion. A layer of a metal or metal silicide might then be provided over the surface of the polysilicon layer to reduce the resistivity of the gate electrode and wiring line conductors. The metal layer is preferably tungsten silicide ($WSi_x$) or titanium silicide ($TiSi_x$) having a thickness of about 1500 Å which is preferably deposited directly by chemical vapor deposition or by using sputtering or another physical vapor deposition technique.

After the silicide layer is provided on the polysilicon layer, a layer of oxide is deposited over the silicide layer, typically by CVD to a thickness on the order of 1000–3000 Å. This oxide layer protects the gate electrode during subsequent processing steps. The gate electrode structure of an oxide layer over a layer of conductor including a layer of polysilicon is then patterned using conventional photolithography to form an array of gate electrodes and wiring lines consisting of a lower layer of polysilicon 16, 18 covered by an optional layer of tungsten silicide or another refractory metal silicide (not shown), which in turn is covered by an oxide layer (not separately shown). It should be noted that both more and less complicated gate electrode structures and wiring line structures might be used. The figures illustrate a simple gate electrode structure including a single layer of polysilicon 16. Similarly, the wiring lines include a lower layer of polysilicon 18 which might be covered by a layer of tungsten silicide or another refractory metal silicide and covered by the preferred doped oxide layer. Moderately doped source/drain regions 20, 22 are formed by ion implantation self-aligned to the gate electrode 16 and device isolation regions 12 in the conventional manner. For example, the source/drain regions might be formed by implanting arsenic or phosphorus ions at an energy of 30–100 KeV to a dosage of between about $1 \times 10^{13}/cm^2$ to $1 \times 10^{14}/cm^2$. In most DRAM applications, it is preferred to not utilize an LDD structure for the source/drain regions, particularly for the capacitor contacts, and instead to use a single doping step to produce more uniformly doped source/drain regions.

After the transfer FET including the source/drain regions 20, 22 are formed, a layer of insulating material 24 is provided over the device. Different materials may be used for the insulating layer 24 and different processes can be used to achieve the desired structure for the insulating layer 24. Preferably, the result of the insulating material formation process is an insulating layer 24 that has a substantially planar surface to facilitate subsequent lithography and etching steps. The insulating layer 24 may, for example, consist of multiple layers of oxide materials beginning with a first oxide layer deposited by plasma enhanced chemical vapor deposition (PECVD) to a depth of 1000–3000 Å or greater. The PECVD oxide layer is then covered by one or more layers of spin-on-glass (SOG) to at least partially planarize the resulting surface. An etch back process can be used to achieve more complete planarization for the insulating layer 24. In an alternate embodiment, a thick layer of TEOS oxide can be deposited by CVD. The surface of the TEOS oxide layer is then planarized using chemical mechanical polishing (CMP). The result of this process is an oxide layer 24 with a total thickness of between about 3000–8000 Å having a substantially planar surface suitable for further processing.

Next, a contact via is opened through the oxide layer 24 and a vertical interconnect is provided that will connect the source/drain region 22 to the lower electrode of the charge storage capacitor. Conventional photolithography is used to provide a contact opening mask on the surface of oxide layer 24 with an opening in the mask aligned above the source/drain region 22. A conventional oxide etching process, for example, using an Applied Materials Precision 5000 etching system with an etchant derived from a mixture of source gases including $CF_4$ defines the contact opening 26 in a manner that exposes a surface of source/drain region 22, as illustrated in FIG. 2.

A thick layer of polysilicon is deposited over the surface of the device. This layer of polysilicon fills contact opening 26 and provides a thick layer of polysilicon over the insulating layer 24 that will be shaped into the crown structure of the lower capacitor electrode. The polysilicon layer is preferably deposited in a low pressure chemical vapor deposition (LPCVD) process and doping of the polysilicon layer is preferably accomplished in situ during deposition by the incorporation of arsine or phosphine gases to provide N-type dopants to the polysilicon layer. Deposited polysilicon fills the contact opening 26 with a vertical interconnect 28 and the deposition process continues to provide a thick layer of polysilicon 30 above the oxide layer 24. The thickness of the polysilicon layer above the insulating layer 24 is approximately equal to the height of the fins 40 above the surface of the oxide layer 24 in FIG. 1 plus the thickness of the bottom plate 38. In the context of these processes, the word approximately here is intended to reflect the normal process variations associated with differences in etching rates and the need to provide overetching to ensure that unwanted polysilicon "stringers" are not left on the surface of oxide layer 24 during later stages of processing. It is desirable for the polysilicon layer 30 to have a fairly planar surface to ensure that subsequent lithography steps adequately clear the surface of the insulating layer 24 and do not overetch the bottom plate 38 of the lower capacitor electrode. Typically, the LPCVD process will provide an acceptably planar surface for the polysilicon layer 30. It may, on the other hand, sometimes be desirable to further planarize the polysilicon surface using CMP or an etch back process.

Figure 3:
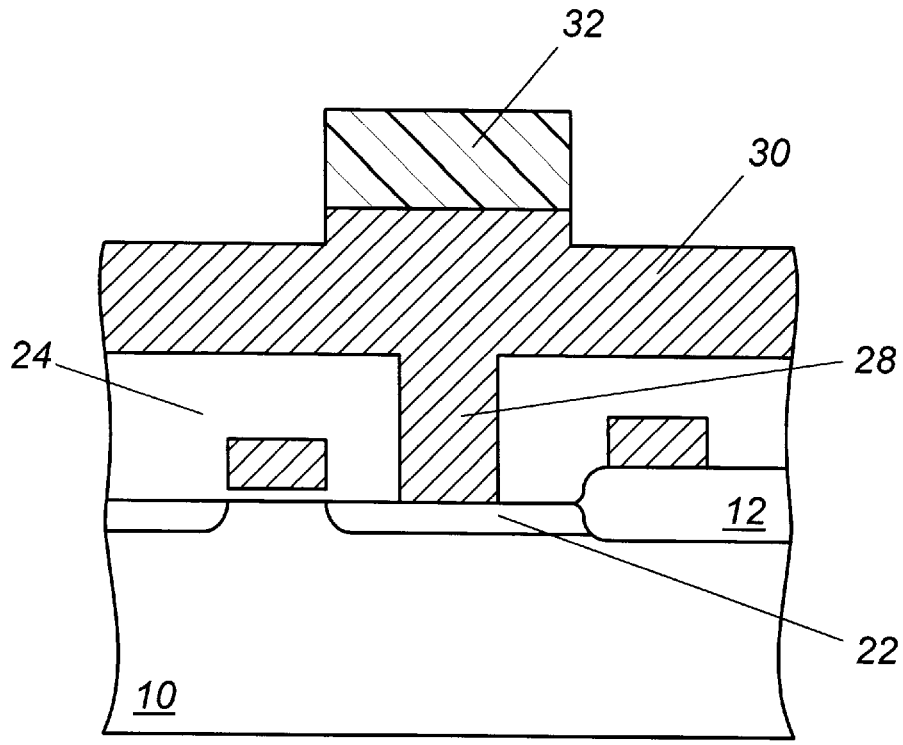

The lower capacitor electrode is now defined from the polysilicon layer 30 using a relatively undemanding lithography step and a sequence of other well understood and controllable process steps. A first etching mask 32 is provided on the surface of polysilicon layer 30 using a conventional photolithography process. It is preferred that the first etching mask 32 be aligned over the contact via so that the edges of the mask 32 are aligned over remaining portions of the oxide layer 24. Using the first etching mask 32, the polysilicon layer 30 is partially etched using a conventional anisotropic polysilicon etching process to a depth approximately equal to that desired for the bottom plate 38 of the capacitor electrode structure. Typically, the etched portion of the polysilicon layer 30 should be recessed by a depth of approximately 1000–3000 Å. This stage of the capacitor formation process is illustrated in FIG. 3. Photoresist etching mask 32 is then removed, for example, by asbing.

Figure 4:
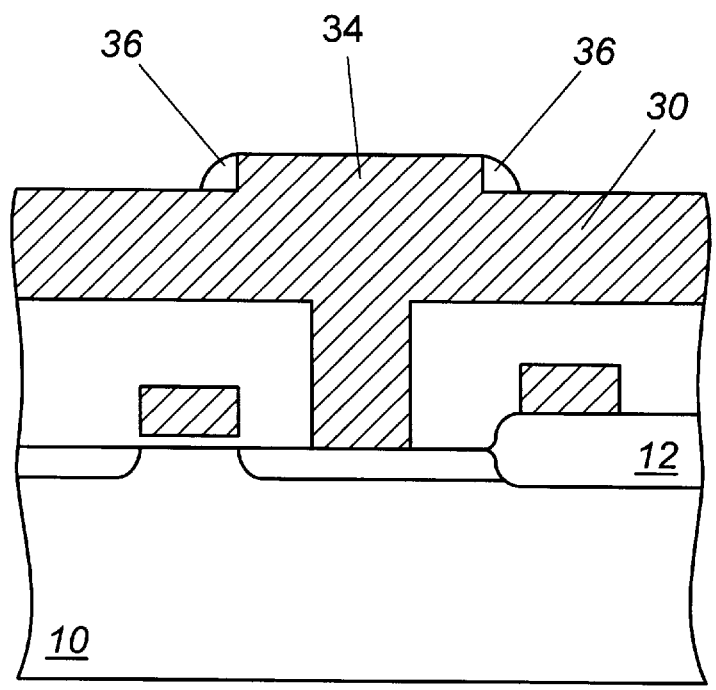

A second etching mask is now defined using an etch back process to provide an etching mask without using lithography. A layer of oxide is deposited over the elevated and recessed surfaces of the polysilicon layer 30, for example, using a CVD process. The thickness of the oxide layer deposited will largely determine the width of the second etching mask structures and so will define the width of the vertically extending fins 40 shown in FIG. 1. After the oxide layer is deposited, the device is subjected to an oxide etch back step, again using a conventional etching process with an etchant derived in a plasma process from a mixture of source gases including $CF_4$. The etching process preferably is continued to completely remove the oxide layer from the elevated surface of the polysilicon layer 30, which should also remove the oxide layer from all of the recessed surfaces of the polysilicon layer 30 except those immediately adjacent the edges of the elevated surface of a polysilicon layer 30. The oxide spacer structures 36 then surround the elevated portion 34 of the polysilicon layer, as shown in FIG. 4.

Figure 5:
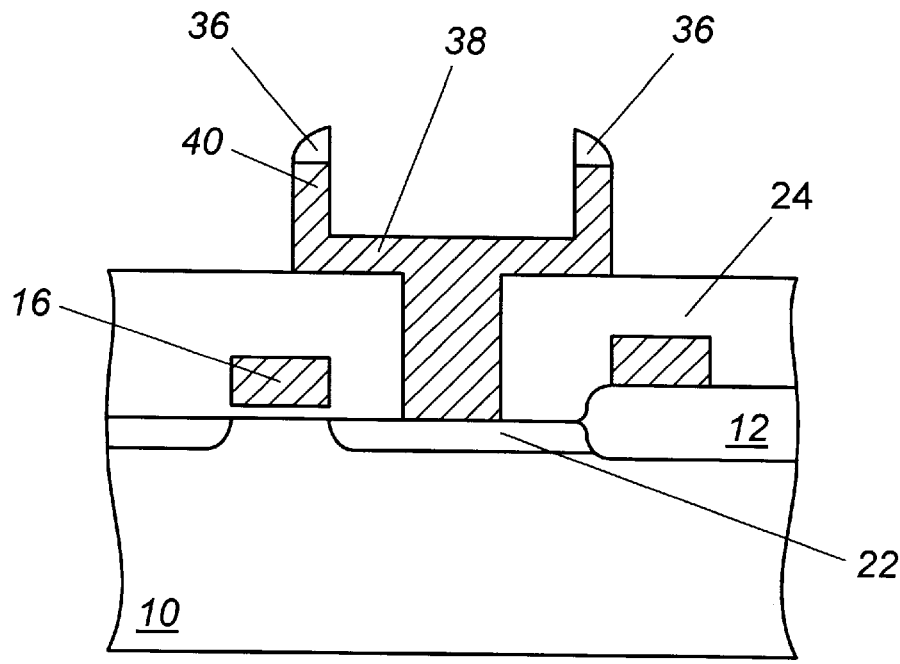

The oxide spacers 36 are then used as an etching mask for simultanesusly etching completely through the recessed portions of the polysilicon layer and partially through the elevated portion 34 of the polysilicon layer. The etching process is performed in a conventional anisotropic manner, which might use the above-referenced Applied Materials Precision 5000 etching system and an etchant derived from a mixture of source gases including HCl and HBr. It is preferred that this etching process be substantially anisotropic so that the fins 40 created in the process as shown in FIG. 5 are not unduly narrowed at the top adjacent the second etching mask 36. Etching of the polysilicon layer is continued to completely clear the surface of oxide layer 24 surrounding the base plate 38. It is often desirable to use an endpoint detection system to identify the point in the etching process when the surface of the oxide layer 24 becomes exposed to the etching environment. Some extent of overetching is necessary to ensure that stringers are not left on the surface of the oxide layer 24, but excessive overetching will undesirably thin the bottom plate 38 of the capacitor electrode. As such, either careful time control or the use of process monitoring such as optical endpoint detection is preferred. Either precise time controls or the use of endpoint detection is facilitated by the planarization of the oxide layer 24 early in the processing. After the polysilicon etching process, the oxide spacers 36 of the second etching mask are preferably removed in a time controlled wet etching process using dilute HF.

After the polysilicon layer has been etched to define the crown structure of the lower capacitor electrode, a layer of capacitor dielectric material 42 is provided over all of the exposed surfaces of the lower charge storage capacitor electrode 38, 40. A capacitor dielectric material might be provided by depositing a thin layer of (~30–50 Å) of CVD silicon nitride and growing a thin layer of oxide (~5–15 Å) on the nitride layer to form the dielectric material known as "NO." In particularly preferred embodiments of the present invention, a higher dielectric constant capacitor dielectric material is chosen. In an alternate embodiment, a layer of tantalum pentoxide, nominally $Ta_2O_5$, is deposited in a chemical vapor deposition (CVD) process from a source gas mixture consisting of Ta $(OC_2H_5)_5 + O_2$. The tantalum pentoxide capacitor dielectric might be deposited in a high density deposition system such as the LAM 9800 Integrity system to a thickness of between about 20–140 Å. The particular thickness chosen for the capacitor dielectric is preferably thin to maximize the resulting capacitance but sufficiently thick to ensure that the capacitor dielectric layer 42 does not have unacceptable pin holes or an unacceptable breakdown voltage.

An upper capacitor electrode 44 is next formed over the DRAM structure in accordance with preferred embodiments of the present invention. For most embodiments, the upper capacitor electrode 50 includes a layer of doped polysilicon deposited to a thickness of 1500–2500 Å. When a tantalum pentoxide capacitor dielectric is used, it is preferred that titanium nitride (TiN) be used to form at least the lower surface of the upper capacitor electrode. Most often, the entire upper capacitor electrode can be formed from titanium nitride due to the high conductivity of titanium nitride. Most preferably, the titanium nitride is deposited over the capacitor dielectric in a low temperature process. Such a low temperature process is preferred because the high dielectric constant capacitor dielectrics preferably used in the present invention typically include oxygen as a constituent element. Thus, any high temperature processes can cause oxide to form at the surface of the lower capacitor electrode. Any such oxide layer formed will constitute a reduced capacitance in series with the capacitance provided by the high dielectric constant material, which would undesirably reduce the capacitance of the DRAM charge storage capacitor. Accordingly, the titanium nitride layer is preferably deposited to a thickness of 1000 Å or less using a sputtering process and a relatively low substrate temperature or, more preferably, the titanium nitride layer is deposited in a chemical vapor deposition (CVD) process. Titanium nitride can be deposited by CVD from $TiCl_4+NH_3$ source gases at a comparatively low substrate temperature. The CVD process has the further advantage over sputtering that CVD is much less likely to heat the deposition substrate during the deposition process. Processing continues to cover the upper capacitor electrode with an insulating layer, to form a bit line contact, and to complete the formation of the DRAM cell shown in FIG. 1 and support circuitry (not shown).

Figure 6:
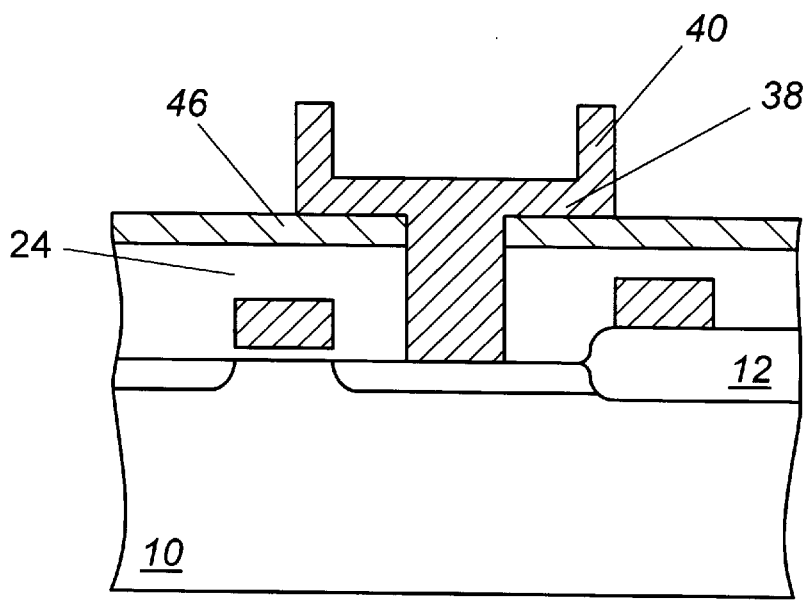
FIGS. 6–7 illustrate an alternate implementation of aspects of the present invention.
Figure 7:
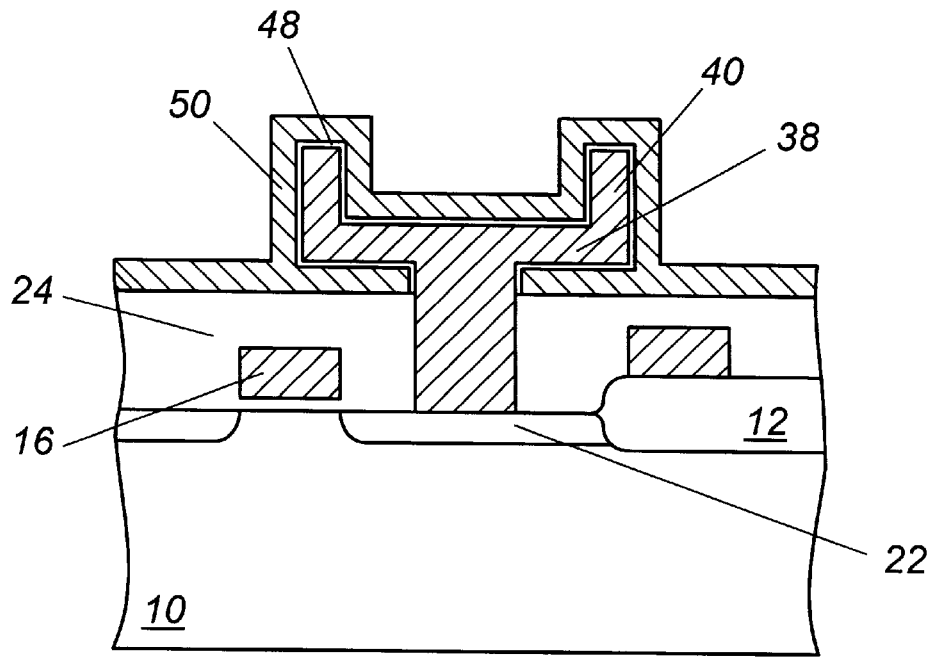

A variation on the embodiments illustrated in FIGS. 1–5 is presented with reference to FIGS. 6–7. The embodiments of FIGS. 6–7 provide additional process margin for the process of etching through the thick polysilicon layer 30. For high speed polysilicon etching processes, such as those that are desirably used to etch through the thick polysilicon layer 30, selectivity between polysilicon and oxide is relatively poor. As such, it is desirable to provide an etch stop layer over the oxide layer 24 to act as a more definitive endpoint for the polysilicon etching process. For example, a layer of silicon nitride 46 might be deposited on the surface of oxide layer 24 before the contact opening 26 is etched through the oxide layer 24. The silicon nitride layer 46 might have a thickness of between about 200–500 Å or whatever is sufficient to act as a reliable etch stop for the polysilicon etching process. The nitride layer 46 can be deposited by CVD in the conventional manner. The contact opening mask is then formed on the silicon nitride layer 46 and the above-discussed processing steps are performed. After the oxide spacers 36 are removed from above the fins 40, the device appears as in FIG. 6. Next, the silicon nitride layer 46 is stripped, preferably in a wet etching process using, for example, a heated phosphoric acid solution. A capacitor dielectric 48 is then provided in a manner discussed above and then an upper capacitor electrode 50 is provided. As shown in FIG. 7, the process flow of this alternate set of embodiments provides additional surface area beneath the bottom plate 38 that can be used for charge storage. Thus, even if process margins for the simpler process of FIGS. 1–5 are acceptable, it may sometimes be desirable to utilize the embodiments of FIGS. 6–7 to achieve higher levels of charge storage.

Figure 8:
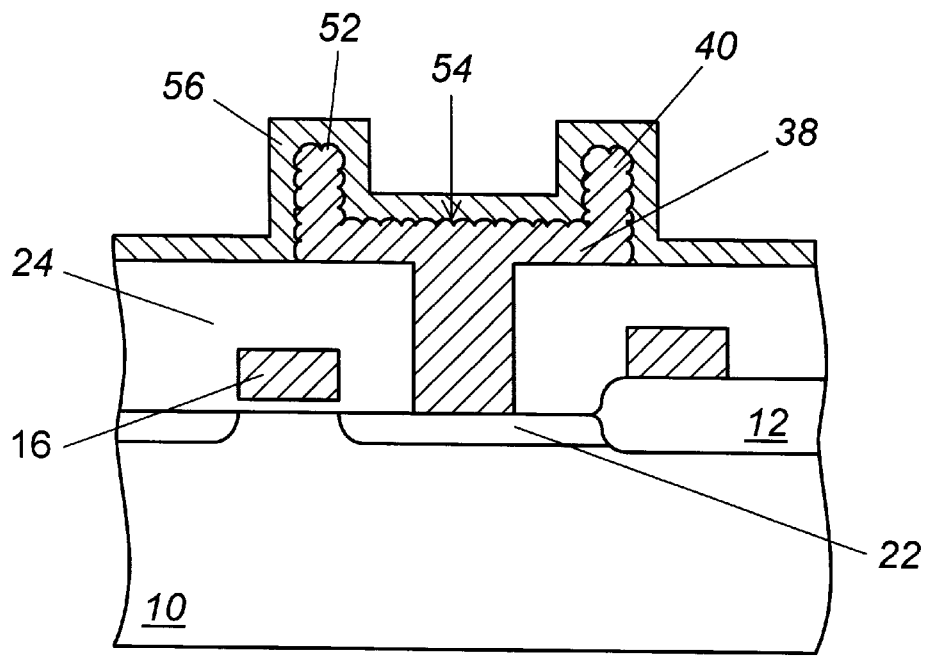
FIG. 8 illustrates another alternate implementation of aspects of the present invention.

Still another alternative for increasing capacitance is shown in FIG. 8. For the FIG. 8 embodiments, additional processing is performed to provide a textured surface on the plate 38 and fins 40 of the capacitor electrode. This may be accomplished by first depositing hemispherical grained silicon (HSG-Si) over the surface of the electrode. As is known in the art, hemispherical grained silicon can be deposited by LPCVD at a substrate temperature of between about 555° C. to about 590° C. The deposited hemispherical grained silicon has a grain size of between about 80–100 nanometers with grains spaced 80–100 nanometers apart, depending upon the precise processing conditions. Because it is sometimes difficult to achieve acceptable doping and surface conditions for hemispherical grained silicon, it is preferred that an etch back process be performed to transfer the surface topography of the hemispherical grained silicon to the underlying polysilicon of the fins 40 and plate 38. This may be accomplished using a substantially isotropic polysilicon etch process which might consist of plasma etching using an etchant derived from $Cl_2$. The etch back process forms a rugged surface 52 over the fins 40 and exposed portions of the bottom plate 38. This series of processing steps provides an approximately 1.8 times increase in the surface area of the capacitor electrode. A capacitor dielectric 54 is formed over the rugged surface 52 of the lower electrode and then an upper electrode 56 is formed in accordance with the methods described above.

The present invention has been described in terms of certain preferred embodiments. Those of ordinary skill in the art will appreciate that certain modifications and variations on the embodiments described herein may be made within the general spirit of the present invention. As such, the scope of the present invention is not to be limited to the particular embodiments described herein. Rather, the scope of the present invention is to be determined from the claims which follow.

What is claimed:

1. A method of making an integrated circuit device, comprising:

providing a transfer FET having a first source/drain region formed in a substrate;

forming an insulating layer over the transfer FET;

forming a contact via through the insulating layer to expose at least a portion of the first source/drain region;

providing a conductive interconnect within the contact via;

providing a layer of conductive material over the insulating layer and connected to the first source/drain region through the conductive interconnect;

providing a first etch mask over the layer of conductive material;

etching partially through the layer of conductive material using the first etch mask to define an elevated portion of the layer of conductive material, the elevated portion of the layer of conductive material having edges aligned with the first etch mask and extending above a recessed position of the layer of conductive material by a first distance;

removing the first etch mask and forming a second etch mask adjacent the edges of the elevated portion of the layer of conductive material, the second etch mask leaving exposed a surface of the elevated position of the layer of conductive material;

forming at least a lower electrode of a charge storage structure by simultaneously etching partially through the elevated portion of the layer of conductive material and completely through the recessed portion of the layer of conductive material, using the second etch mask to define a peripheral portion of the lower electrode;

providing a dielectric layer over the lower electrode; and providing an upper electrode over the dielectric layer.

2. The method of claim 1, further comprising the step of planarizing the insulating layer prior to forming the contact via.

3. The method of claim 2, wherein the layer of conductive material is doped polysilicon and wherein the layer of conductive material is planarized.

4. The method of claim 1, wherein the second etch mask is formed without a lithography process.

5. The method of claim 1, wherein the second etch mask is formed using the steps of:

blanket depositing an etch material over the elevated portion of the layer of conductive material; and etching back the etch material to form the second etch mask so that the second etch mask extends along the edges of the elevated portion of the layer of conductive material and extends over a portion of the recessed portion of the layer of conductive material.

6. The method of claim 5, wherein the second etch mask does not extend onto the surface of the elevated portion of the layer of conductive material.

7. The method of claim 6, wherein the etch material is an oxide.

8. The method of claim 1, wherein the lower electrode includes a lower plate and a crown structure extending above the lower plate, the lower plate having a plate thickness approximately equal to the first distance.

9. The method of claim 2, further comprising the step of providing an etch stop layer over the insulating layer prior to the step of providing the layer of conductive material.

10. The method of claim 9, wherein the etch stop layer comprises silicon nitride.

11. The method of claim 9, wherein the etch stop layer provides a stop for the step of etching completely through the recessed portion of the layer of conductive material.

12. The method of claim 11, wherein the layer of conductive material is doped polysilicon.

13. The method of claim 1, wherein the lower electrode includes a lower plate and a crown structure extending above the lower plate, wherein the method further comprises the step of forming hemispherical grained silicon on the crown structure.

14. The method of claim 13, further comprising the step of etching back the hemispherical grained silicon.

15. The method of claim 1, wherein the elevated portion of the layer of conductive material is aligned over the contact via with the edges of the elevated portion aligned over the insulating layer subsequent to said forming a contact via.

* * * * *